United States Patent
Lee et al.

(10) Patent No.: US 7,176,512 B2
(45) Date of Patent: Feb. 13, 2007

(54) SEMICONDUCTOR MEMORY DEVICE HAVING HIGH ELECTRICAL PERFORMANCE AND MASK AND PHOTOLITHOGRAPHY FRIENDLINESS

(75) Inventors: Jung-Hyeon Lee, Yongin-si (KR); Gi-Sung Yeo, Seoul (KR); Doo-Hoon Goo, Hwaseong-si (KR); Woo-Sung Han, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 176 days.

(21) Appl. No.: 10/918,175

(22) Filed: Aug. 13, 2004

(65) Prior Publication Data
US 2005/0035387 A1  Feb. 17, 2005

(30) Foreign Application Priority Data
Aug. 16, 2003  (KR)  ............. 10-2003-0056712

(51) Int. Cl.
*H01L 27/108*  (2006.01)
*H01L 29/76*  (2006.01)
*H01L 29/94*  (2006.01)
*H01L 31/119*  (2006.01)

(52) U.S. Cl. .................... 257/296; 257/306
(58) Field of Classification Search ......... 257/295–310
See application file for complete search history.

(56) References Cited

U.S. PATENT DOCUMENTS

2001/0006473 A1*  7/2001  Kang et al. ............... 365/145

* cited by examiner

*Primary Examiner*—Cuong Nguyen
(74) *Attorney, Agent, or Firm*—F. Chau & Associates, LLC

(57) ABSTRACT

A semiconductor memory device comprises a plurality of rows, each row comprising a plurality of active regions arranged at a pitch wherein the active regions in adjacent rows are shifted with respect to each other by one half of the pitch, wherein a distance between each active region in a row is equal to a distance between active regions in adjacent rows.

14 Claims, 18 Drawing Sheets

2a 2c 2e 2g 2i 2k 2l
2b 2d 2f 2h 2j

SEMICONDUCTOR MEMORY DEVICE HAVING HIGH ELECTRICAL PERFORMANCE AND MASK AND PHOTOLITHOGRAPHY FRIENDLINESS

CROSS-REFERENCE TO RELATED APPLICATION

This application claims priority to Korean Patent Application No. 2003-56712, filed on Aug. 16, 2003, in the Korean Intellectual Property Office, the disclosure of which is incorporated herein in its entirety by reference.

TECHNICAL FIELD

The present disclosure relates to a semiconductor device and, more particularly, to a semiconductor memory device having high electrical performance, mask friendliness and photolithography friendliness.

BACKGROUND

Highly integrated Dynamic Random Access Memory (DRAM) devices such as 256 MB DRAMs and gigabit DRAMs can be constructed due to technological advances that have enabled increases in storage capacity. To manufacture a highly integrated DRAM, a variety of memory cell layouts satisfying a design rule have been proposed. Generally, a preferable memory cell layout contains characteristics such as mask friendliness and photolithography friendliness. A memory cell transistor fabricated using the desirable memory cell layout is expected to have high electrical performance. Mask friendliness is attained if limitations of mask manufacturing process are met, writing time is shortened and mask fidelity is satisfied. The photolithography friendliness can be attained if an optical process is corrected with a single-pitch layout.

Conventional layouts of active regions of a memory cell include a layout of straight active regions and a layout of diagonal active regions. U.S. Pat. Nos. 5,194,752, 5,305,252 and 6,031,262 disclose the layout of diagonal active regions.

FIG. 1A shows the conventional layout of straight active regions 1 on a wafer. FIG. 1B is a plan view of a mask pattern for forming the conventional layout of straight active regions shown in FIG. 1A. FIG. 1C is a plan view of active regions AR1 and word lines WL1. The active regions AR1 are printed on the wafer using the mask pattern shown in FIG. 1B. FIG. 2A shows the conventional layout of diagonal active regions 2. FIG. 2B is a plan view of a mask pattern for forming the conventional layout of diagonal active regions shown in FIG. 2A. FIG. 2C is a plan view of active regions AR2 and word lines WL2. The active regions AR2 are printed on the wafer using the mask pattern shown in FIG. 2B.

Referring to FIG. 1B, the mask pattern for forming the straight active regions AR1 shown in FIG. 1C requires a plurality of auxiliary patterns 1b, 1c, 1d and 1e with different sizes. The auxiliary patterns 1b, 1c, 1d and 1e are disposed adjacent to a main pattern 1a. The auxiliary patterns 1b, 1c, 1d and 1e are used for optical corrections. Referring to FIG. 2B, the mask pattern for forming the diagonal active regions AR2 shown in FIG. 2C includes at least twelve rectangular patterns 2a, 2b, 2c, 2d, 2e, 2f, 2g, 2h, 2i, 2j, 2k and 2l. The twelve rectangular patterns 2a to 2l define one active region. It is known that the mask patterns shown in FIGS. 1B and 2B are difficult to fabricate and have low mask fidelity. Further it takes a long time to fabricate the mask patterns, and photolithography using the mask patterns has a low process margin.

With the conventional layout of straight active regions, two word lines WL1 intersect each active region AR1 as shown in FIG. 1C to form memory cell pairs. That is, a memory cell pair is formed in each active region AR1. The word lines WL1 cross the edge of the active regions AR1. The width of the edge of the active region AR1 is narrower than the width of the center of the active region AR1 because the edge of the active region AR1 is more affected by an optical proximity effect than the center of the active region AR1. Thus, an actual gate width GW1 of a memory cell transistor is narrower than the width of the active region AR1.

With the conventional layout of diagonal active regions two word lines WL2 intersect each active region AR2 as shown in FIG. 2C to form memory cell pairs. The word lines WL2 cross the active regions AR2 diagonally. As a result, the whole intersection of the word line WL2 and the active region AR2 cannot be used as an actual gate region. Only a portion indicated by a shaded area A can be used as the actual gate region. Accordingly, an actual gate width GW2 is narrower than the width of the active region AR2. As the actual gate width decreases, the threshold voltage Vth of the memory cell transistor decreases. The decreased threshold voltage increases sub-threshold leakage current, and deteriorates dynamic refresh characteristic of DRAMs. In FIGS. 1C and 2C, GL1 and GL2 represent gate lengths.

SUMMARY OF THE INVENTION

Exemplary embodiments of the invention generally include semiconductor memory devices having high integrity density, mask and photolithography friendliness, and high electrical performance.

More specifically, in an exemplary embodiment of the invention, a semiconductor memory device comprises a plurality of rows, each row comprising a plurality of active regions arranged at a pitch wherein the active regions in adjacent rows are shifted with respect to each other by one half of the pitch, wherein a distance between each active region in a row is equal to a distance between active regions in adjacent rows.

In another exemplary embodiment of the invention, a semiconductor memory device comprises: active regions constructed such that a first row in which the active regions are arranged at a pitch and a second row in which active regions are arranged at the pitch, wherein the of active regions in the second row are shifted from the active regions of the first row in the direction of a row, wherein the first row and the second row are arranged alternately; and word lines arranged in the direction of a column, wherein the word lines intersect each active region, wherein the pitch is a sum of a width of an active region and a distance between each active region in a row, and the pitch is four times of a width of a word line.

In yet another exemplary embodiment of the invention, a semiconductor memory device comprises: a substrate; word lines extended in a column direction and arranged in parallel on the substrate; bit lines extended in a row direction perpendicular to the column direction such that the bit lines intersect the word lines and are arranged in parallel on the substrate; active regions formed on the substrate, each of the active regions including a first impurity region, a second impurity regions formed therein, a channel region defined by the first impurity region and the second impurity region, being crossed by each word line formed on the channel region; and a memory cell array comprising memory cell pairs, each memory cell of each of the memory cell pairs being formed in one of the active regions and comprising a charge storage capacitor, a first contact connecting one of the bit lines to the first impurity region and a second contact connecting a storage node of the charge storage capacitor to the second impurity region, the first contact of each of the memory cell pairs being electrically connected to each other.

In another exemplary embodiment of the invention, a semiconductor memory device comprises: word lines arranged such that a group in the order of a first, a second, a third and a fourth word lines repeats; bit lines arranged such that a group in the order of a first, a second, a third and a fourth bit lines repeats; first memory cell pairs arranged in a matrix form and connected to the first bit line, each of the first memory cell pairs comprising a first memory cell formed in a first active region intersecting the first word line and a second memory cell formed in a second active region intersecting the second word line; second memory cell pairs arranged in the matrix form and connected to the third bit line, each of the second memory cell pairs comprising a third memory cell formed in a third active region intersecting the third word line and a fourth memory cell formed in a fourth active region intersecting the fourth word line; third memory cell pairs arranged in the matrix form and connected to the second bit line, each of the third memory cell pairs comprising a fifth memory cell formed in a fifth active region intersecting the second word line and a sixth memory cell formed in a sixth active region intersecting the third word line; and fourth memory cell pairs arranged in the matrix form and connected to the fourth bit line, each of the fourth memory cell pairs comprising a memory cell formed in a seventh active region intersecting the fourth word line and a memory cell formed in an eighth active region intersecting the first word line belonging to a group adjacent to the word line group including the fourth word line, wherein the matrix form is a form of rectangular arrangement.

In yet another exemplary embodiment of the invention, a semiconductor memory device comprises: a unit cell having a length equal to four minimum feature size in a row direction and a length equal to two minimum feature size in a column direction such that the unit cell has an area equal to eight minimum feature size squared, wherein each of an access word line, a storage node contact, a bit line contact, and a pass word line have one minimum feature size in the row direction, wherein each of a bit line and a bit line space have one minimum feature size in the column direction.

These and other exemplary embodiments aspects, features, etc., of the invention will become more apparent by describing in detail exemplary embodiments thereof with reference to the attached drawings.

BRIEF DESCRIPTION OF THE DRAWINGS

FIG. 2b is a plan view of a mask pattern for forming a conventional layout of the diagonal active regions shown in FIG. 2a.

FIG. 3b is a plan view of a mask pattern used to form the active regions shown in FIG. 3a.

FIGS. 5b and 5c are plan views of mask patterns used to form the self-aligned contacts shown in FIG. 5a.

FIG. 6b is a plan view of a mask pattern used to form the bit line contacts shown in FIG. 6a.

FIG. 7b is a plan view of a mask pattern used to form the storage node contacts shown in FIG. 7a.

DETAILED DESCRIPTION OF EXEMPLARY EMBODIMENTS

Exemplary embodiments of the present invention will now be described more fully with reference to the accompanying drawings. This invention may, however, be embodied in many different forms and should not be construed as being limited to the exemplary embodiments set forth herein. Rather, these exemplary embodiments are provided so that this disclosure will be thorough and complete, and will fully convey the concept of the invention to those skilled in the art.

A semiconductor memory device according to an exemplary embodiment of the present invention includes a memory cell array suitable for high integration. The semiconductor memory device includes a symmetrical memory cell structure having mask friendliness and photolithography friendliness. A word line crosses the center of an active region to obtain a maximum gate width of a memory cell transistor. The memory cell array included in the semiconductor memory device according to an exemplary embodiment of the present invention may be fabricated using a conventional fabrication process.

Figure 3A:
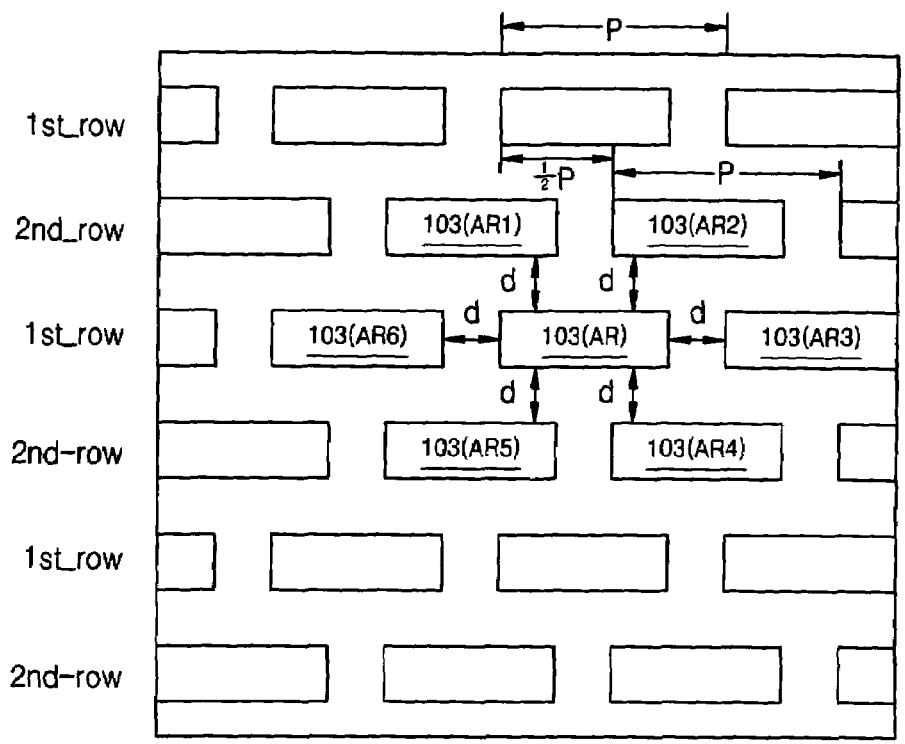
FIG. 3a shows a layout of active regions of a memory cell array in a semiconductor memory device according to an exemplary embodiment of the present invention.
Figure 3B:
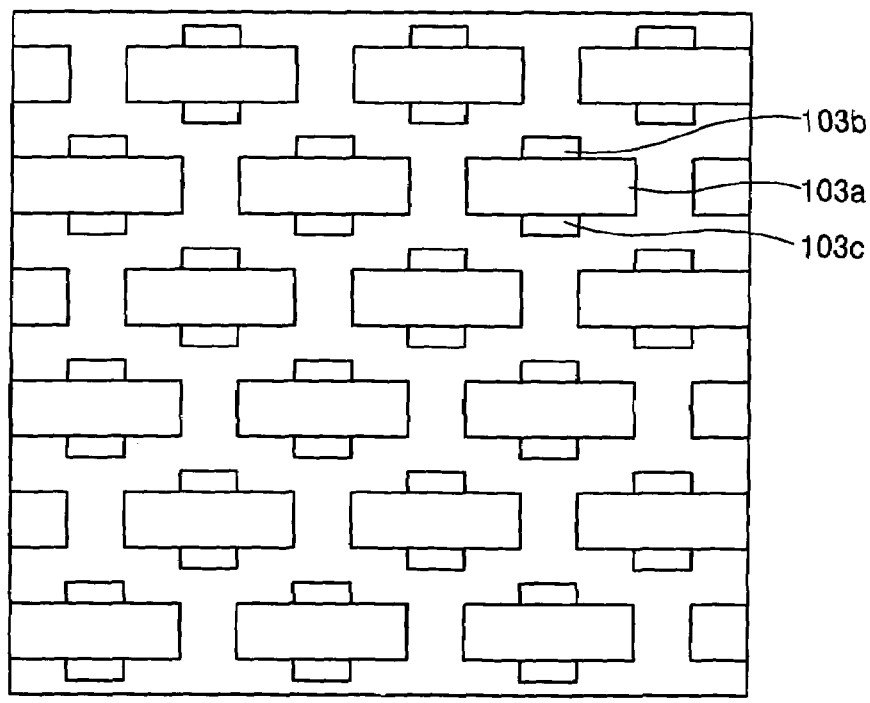
Figure 3C:
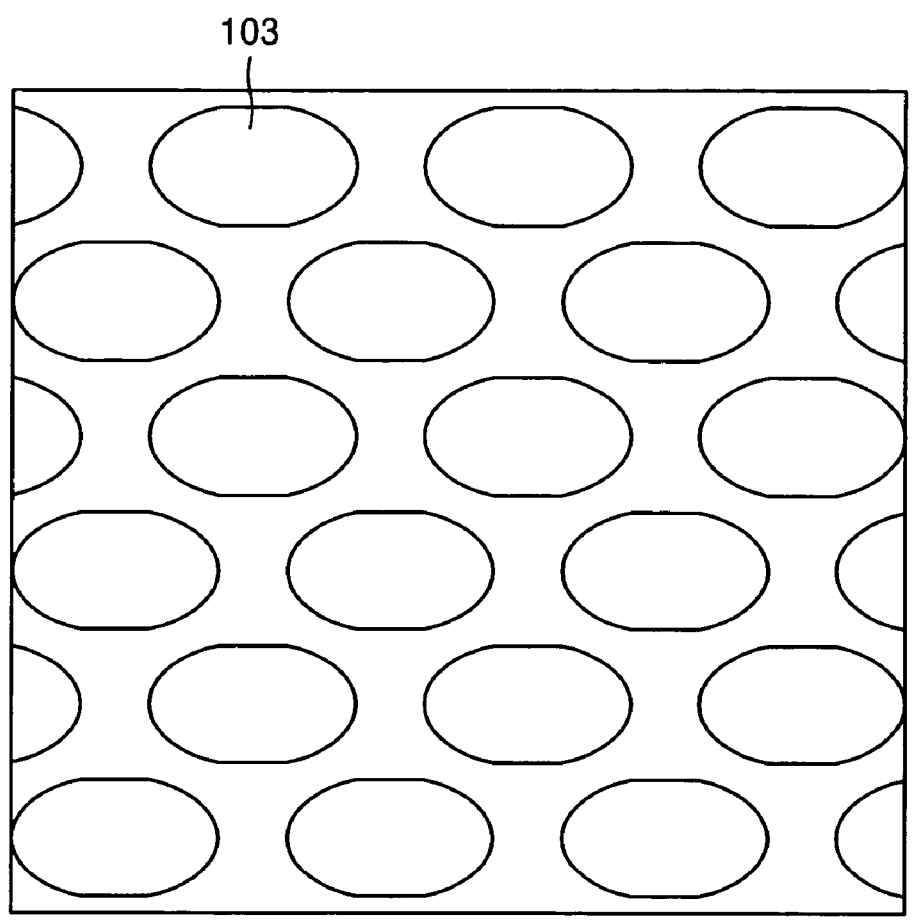
FIG. 3c is a plan view of the active regions of FIG. 3a printed on a wafer.

FIG. 3A shows a layout of active regions 103(AR) of a memory cell array according to an exemplary embodiment of the present invention. FIG. 3B is a plan view of a mask pattern used to form the active regions shown in FIG. 3A. FIG. 3C is a plan view of the active regions 103 printed on a wafer.

Referring to FIGS. 3A and 3B, a plurality of active regions 103 (AR) are arranged in a matrix form. In other words, in a first row 1st_row, a plurality of active regions 103 (AR) are arranged at a pitch P. The pitch P represents, for example, the sum of the width of the active region 103 and the distance between each active region in a row as shown in FIG. 3A. In a second row 2nd_row, a plurality of active regions 103 (AR) are arranged at the pitch P. The active regions 103 (AR) of the second row 2nd_row are shifted in the direction of the row from the active regions 103 (AR) of the first row 1st_row by a distance. The direction of the row means, for example, the direction to left or right as shown in FIG. 3A. As a result, the active regions 103 (AR) of the first row 1st_row and the second row 2nd_row are alternately arranged. A distance d between adjacent active regions 103 (AR) is same from all directions. For example, as shown in FIG. 3A, the distance d between: 103(AR) and 103(AR1); 103(AR) and 103(AR2); 103(AR) and 103(AR3); 103(AR) and 103(AR4); 103(AR) and 103 (AR5); and 103(AR) and 103(AR6) is same. The distance between 103(AR) and 103(AR1) is a distance between adjacent rows. Since the distance d is same from all directions, high integration density of the semiconductor memory device can be accomplished. The distance d between adjacent active regions 103 (AR) corresponds to the minimum feature size in a line pattern and a space pattern in the fabrication of the semiconductor memory device.

In an exemplary embodiment of the present invention, the active regions 103 (AR) of the second row 2nd_row are shifted in the direction of the row from the active regions 103 (AR) of the first row 1st_row by half of the pitch P (½P).

Figure 1A:
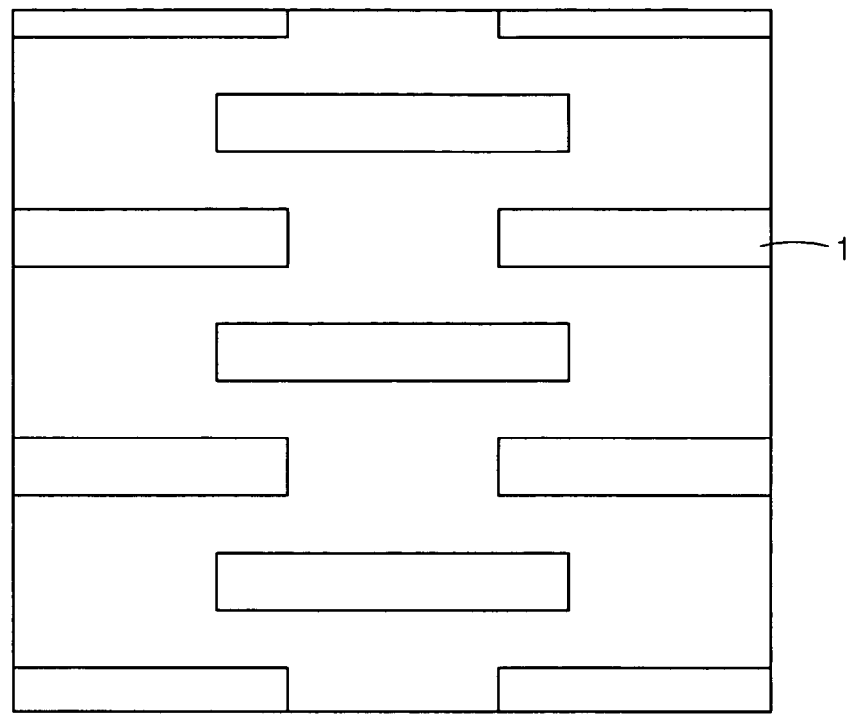
FIG. 1a shows a conventional layout of straight active regions.
Figure 1B:
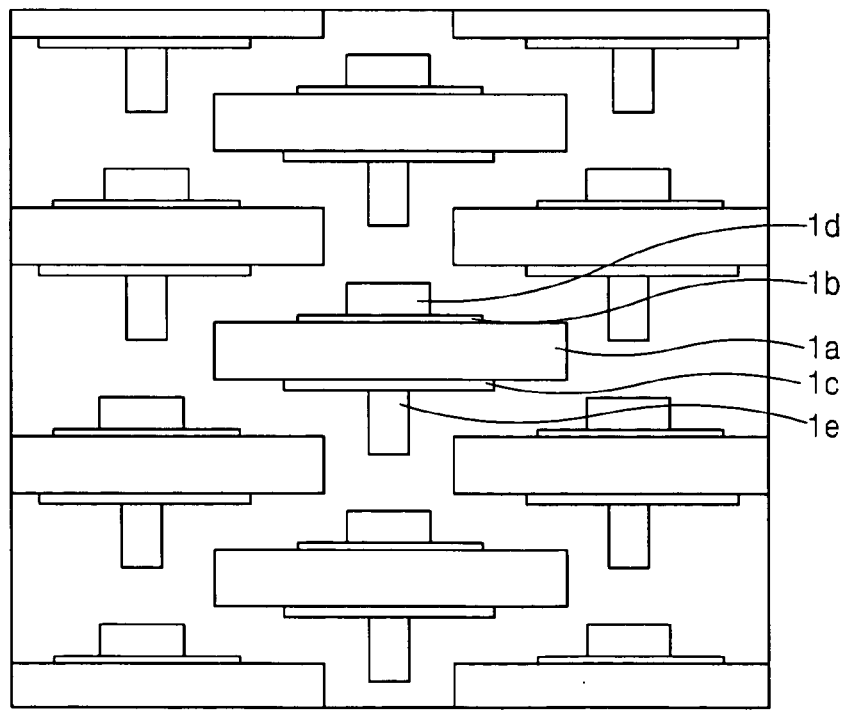
FIG. 1b is a plan view of a mask pattern for forming a conventional layout of the straight active regions shown in FIG. 1a on a wafer.
Figure 1C:
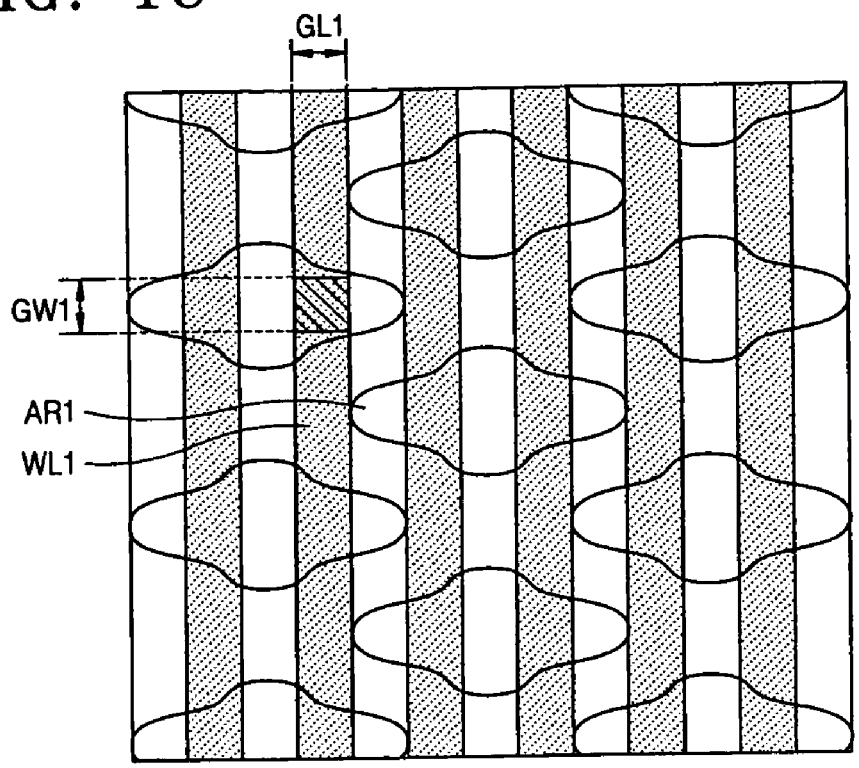
FIG. 1c is a plan view of the straight active regions of FIG. 1a and word lines printed on a wafer.

As shown in FIG. 3B, the mask pattern for patterning the active regions 103 (AR) according to an exemplary embodiment of the present invention is simpler than a conventional mask pattern. Further, the number of auxiliary patterns 103b and 103c is less than the number of auxiliary patterns in conventional mask patterns, for example, shown in FIGS. 1B and 2B. The mask pattern according to an exemplary embodiment of the present invention can be easily fabricated within a short period of time when symmetrical auxiliary patterns 103b and 103c are used.

Figure 4A:
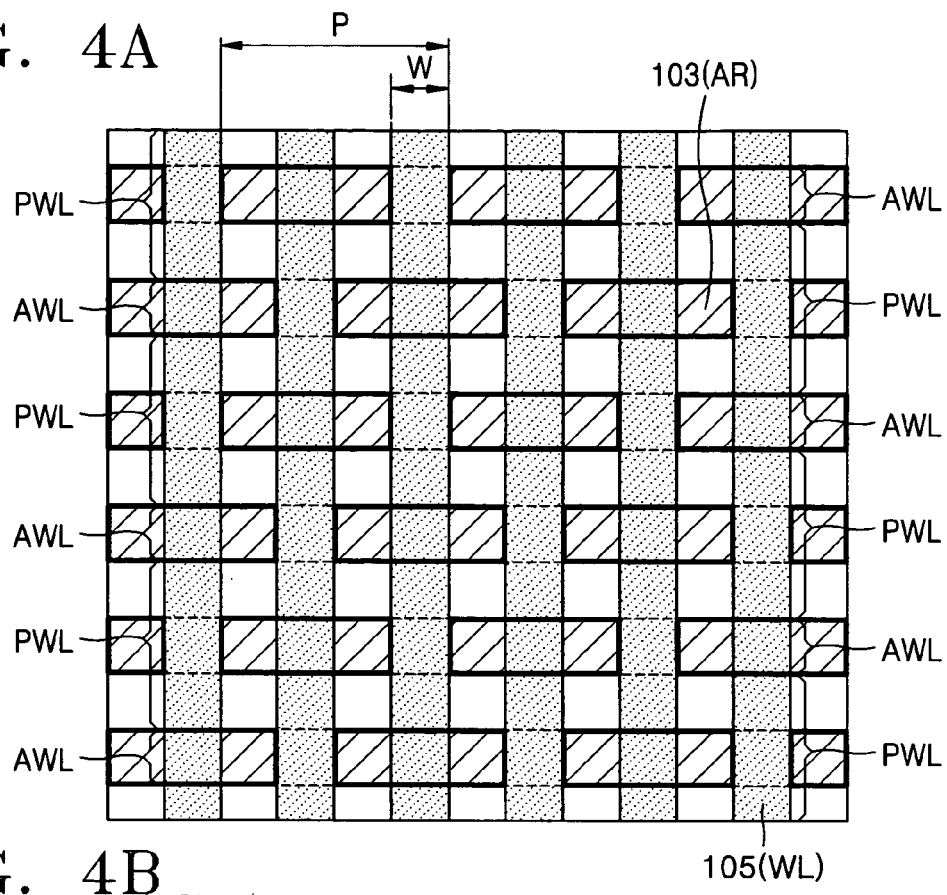
FIG. 4a shows a layout of word lines of a memory cell array in a semiconductor memory device according to an exemplary embodiment of the present invention.
Figure 4B:
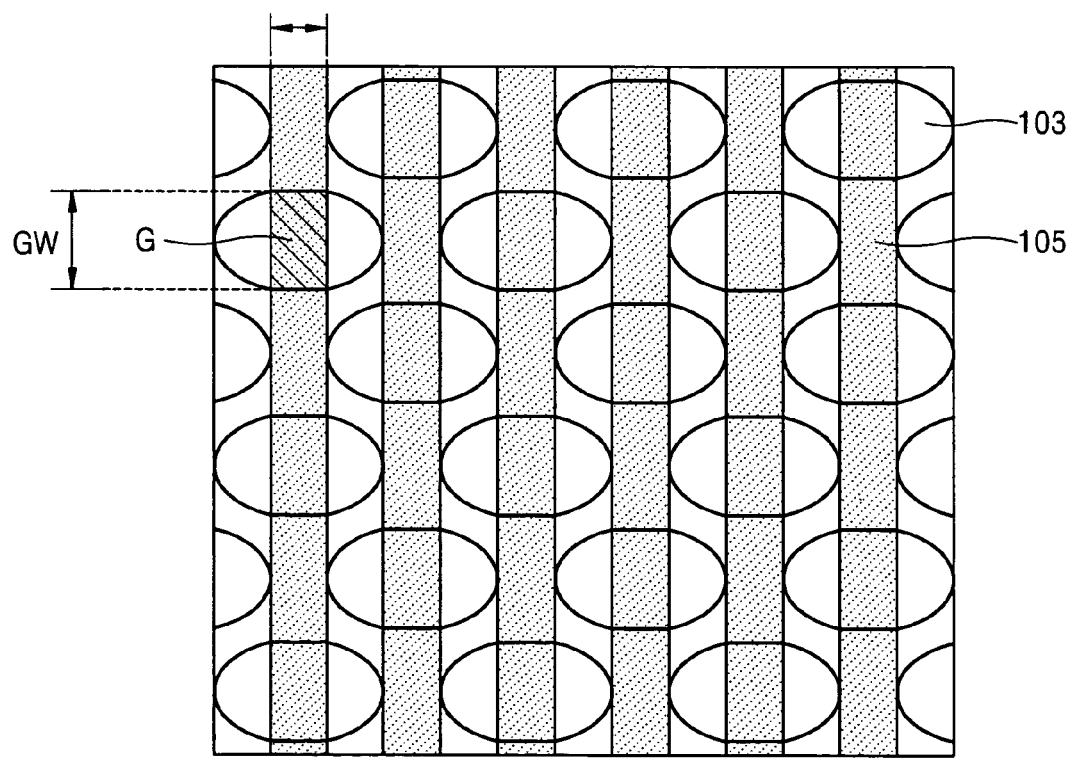
FIG. 4b is a plan view of the word lines of FIG. 4a printed on a wafer.

FIG. 4A shows a layout of word lines 105(WL) of a memory cell array of a semiconductor memory device according to an exemplary embodiment of the present invention. FIG. 4B is a plan view of the active regions 103 and word lines 105 printed on a wafer.

Referring to FIG. 4A, the active regions 103(AR) and the word lines 105(WL) are arranged such that two word lines cross each active region. The pitch P of the active regions 103(AR) is four times longer than the line width W of the word line 105(WL), thereby increasing the integration density of the semiconductor memory device.

The word lines 105(WL) are formed on the active regions 103(AR). Each word line 105 (WL) includes access word lines AWL and pass word lines PWL, which are alternately arranged. The access word lines AWL are used for a switching function of memory cell transistors. The pass word lines PWL are formed in an isolation region positioned between neighboring active regions for transmitting access signals.

Referring to FIG. 4B, the word lines 105 intersect the active regions 103 perpendicularly such that most portions of the intersection G are used as the gate of the memory cell transistor. Further, since the word lines 105 intersect the center of the active regions 103, which is the least affected region by the optical proximity effect, the gate width GW can be maximized. In FIG. 4B, GL represents a gate length.

Figure 5A:
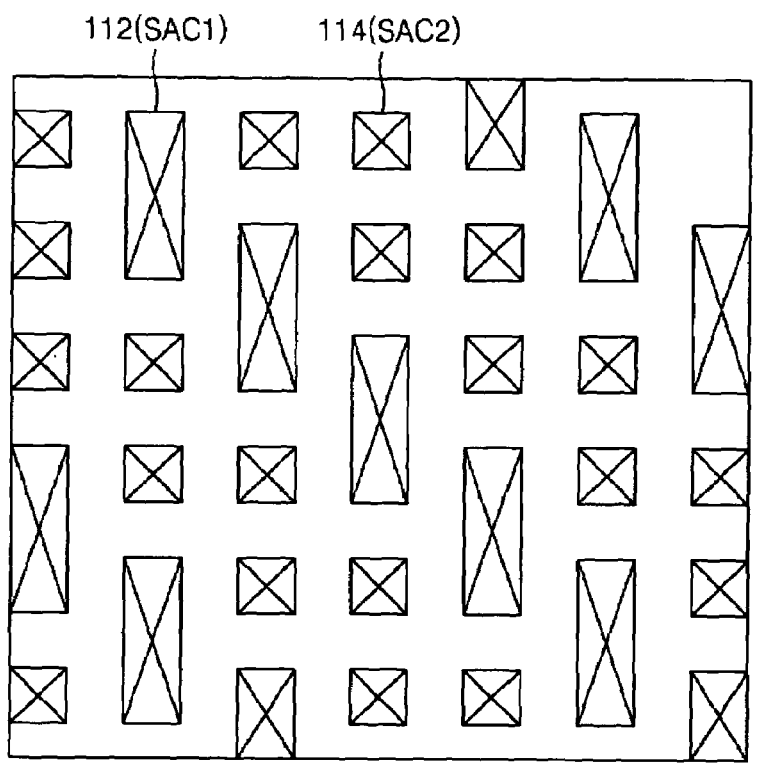
FIG. 5a shows a layout of self-aligned contacts of a memory cell array in a semiconductor memory device according to an exemplary embodiment of the present invention.
Figure 5B:
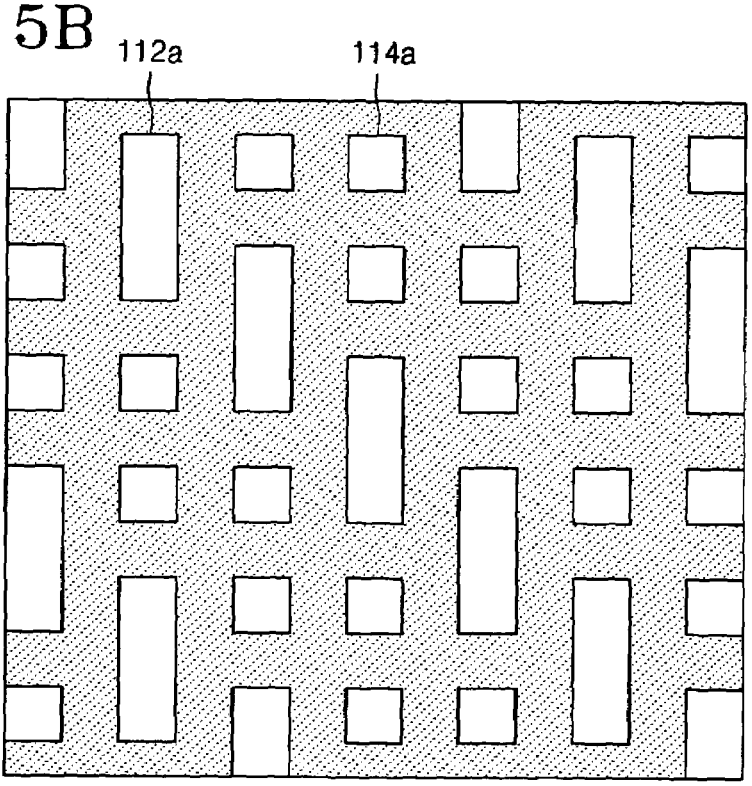
Figure 5C:
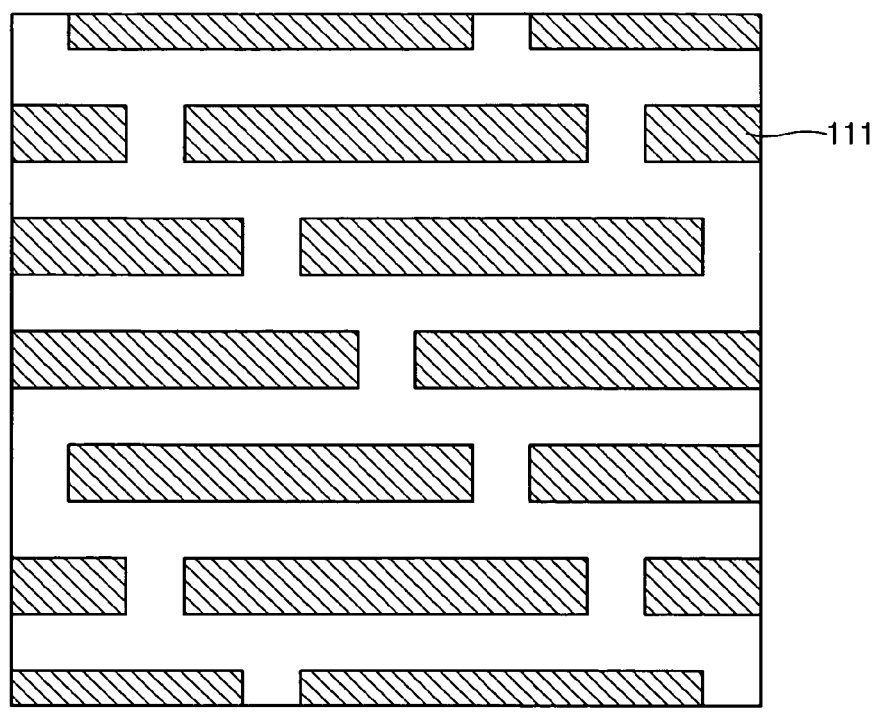
Figure 5D:
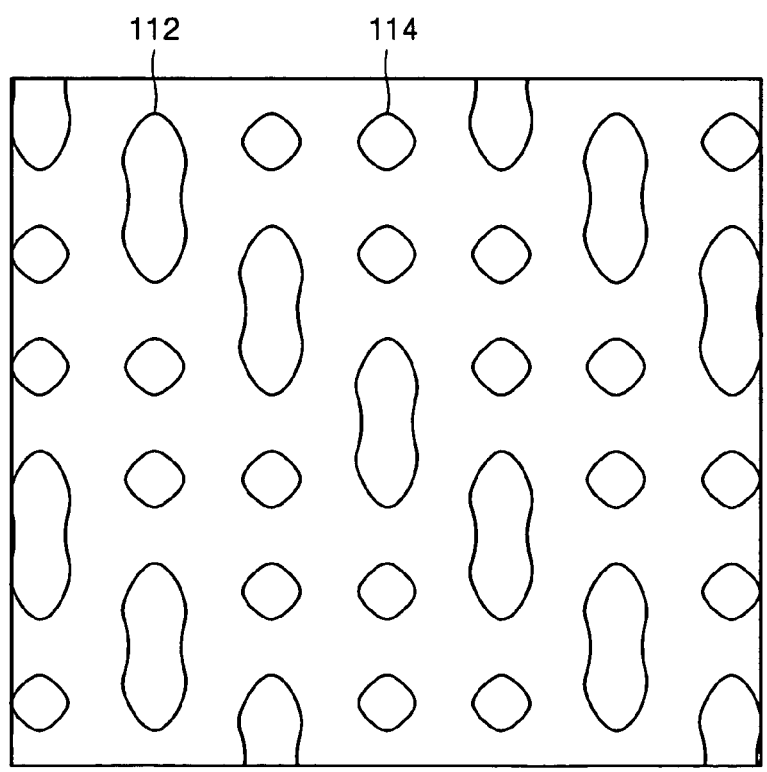
FIG. 5d is a plan view of the self-aligned contacts of FIG. 5a printed on a wafer.

FIG. 5A shows a layout of first self-aligned contacts 112(SAC1) and second self-aligned contacts 114(SAC2) of a memory cell array in a semiconductor memory device according to an exemplary embodiment of the present invention. FIGS. 5B and 5C are plan views of mask patterns for forming the self-aligned contacts 112(SAC1) and 114 (SAC2). FIG. 5D is a plan view of the self-aligned contacts 112 and 114 printed on a wafer.

Referring to FIG. 5A, the first self-aligned contacts 112 (SAC1) and second self-aligned contacts 114(SAC2) are formed in active regions. The first self-aligned contacts 112(SAC1) electrically contact first impurity region (106 of FIGS. 10A, 10B, and 10D) serving as source and drain regions. The second self-aligned contacts 114(SAC2) electrically contact second impurity region (107 of FIGS. 1A, 10B, and 10D) serving as source and drain regions. The first self-aligned contacts 112 (SAC1) connects a bit line to the first impurity region. The second self-aligned contacts 114 (SAC2) connect a storage electrode of a charge storage capacitor of a memory cell transistor to the second impurity region.

FIG. 5B shows a mask pattern in which the first self-aligned contacts 112(SAC1) and the second self-aligned contacts 114(SAC2) are defined by transparent regions 112a and 114a. FIG. 5C shows a mask pattern in which the first self-aligned contacts 112(SAC1) and the second self-aligned contacts 114(SAC2) are defined by a bar-shape opaque region 111. According to an exemplary embodiment of the present invention, the first self-aligned contacts and the second self-aligned contacts can be fabricated using the bar type mask pattern, having mask and photolithography friendliness, shown in FIG. 5C.

Referring to FIG. 5D, the first self-aligned contacts 112 connected to the first impurity region and the second self-aligned contact 114 connected to the second impurity region are formed in each active region. The second self-aligned contacts 114 of adjacent active regions of the first and second rows are connected to each other to form a single contact. Accordingly, the memory cell array includes memory cell pairs, each of which includes two memory cells.

Figure 6A:
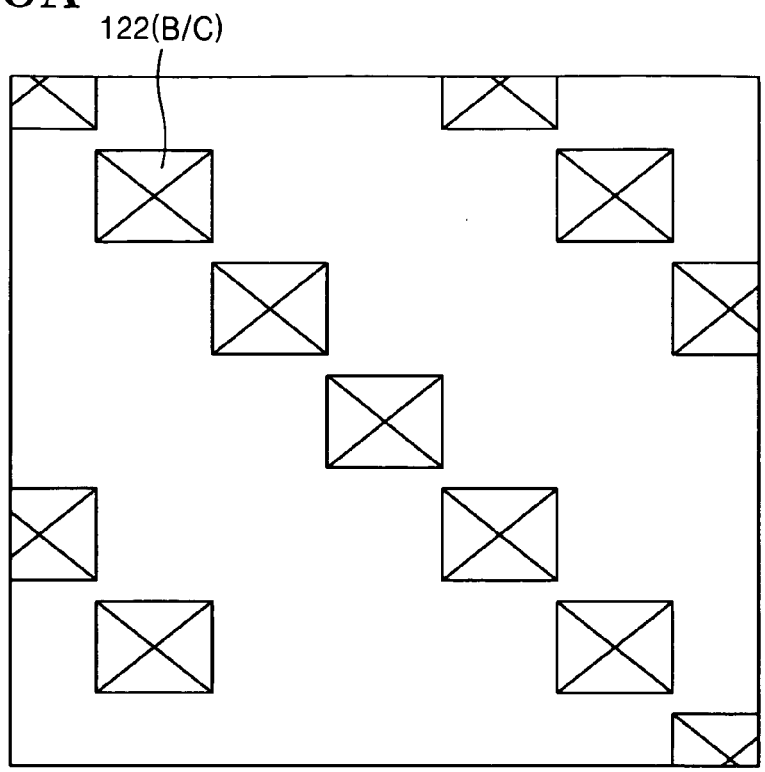
FIG. 6a shows a layout of bit line contacts of a memory cell array in a semiconductor memory device according to an exemplary embodiment of the present invention.
Figure 6B:
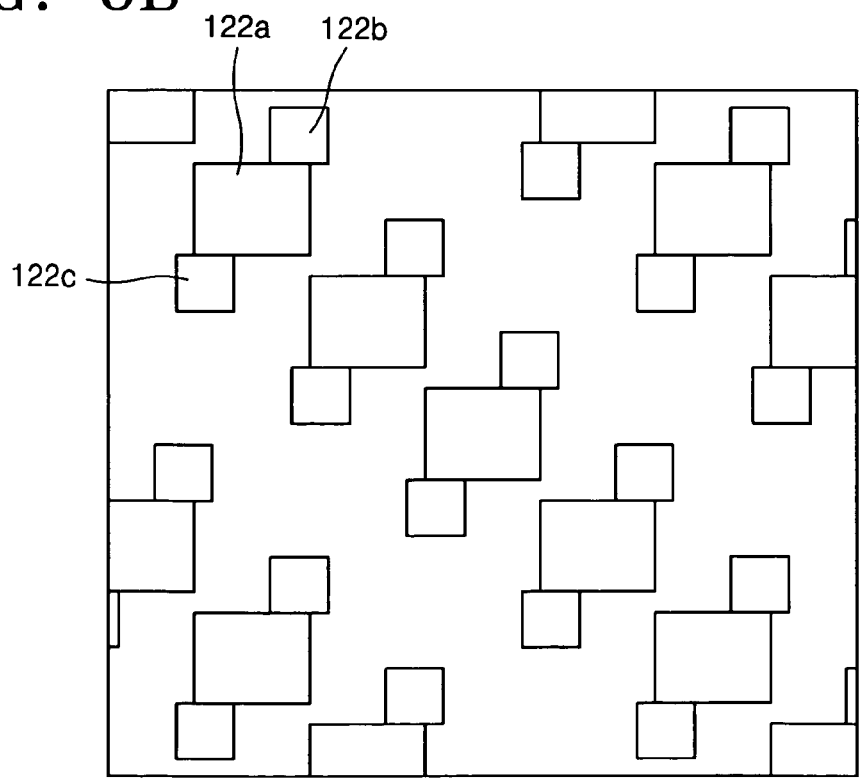
Figure 6C:
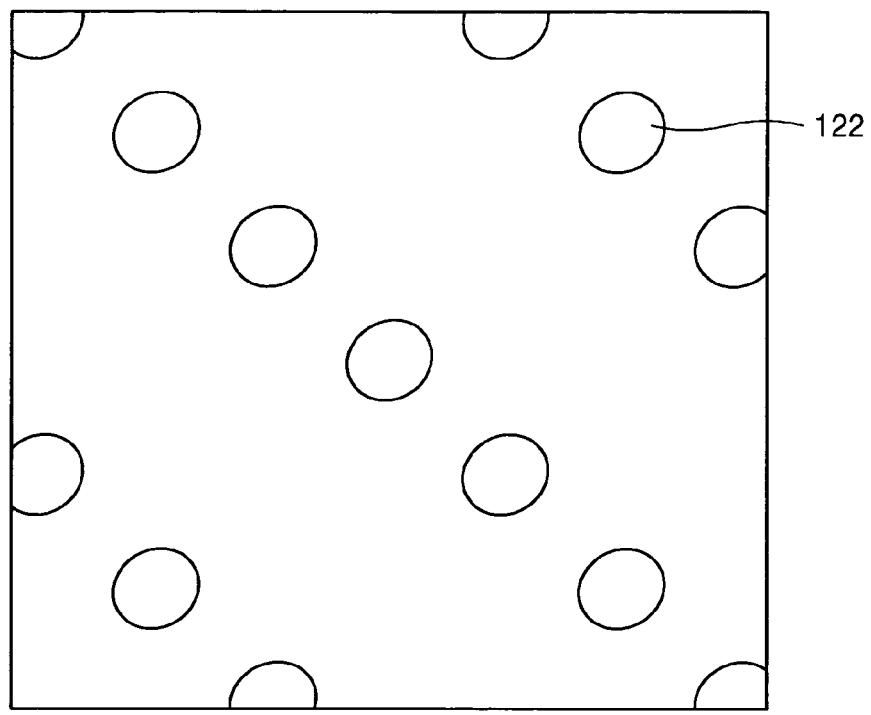
FIG. 6c is a plan view of the bit line contacts of FIG. 6a printed on a wafer.
Figure 10A:
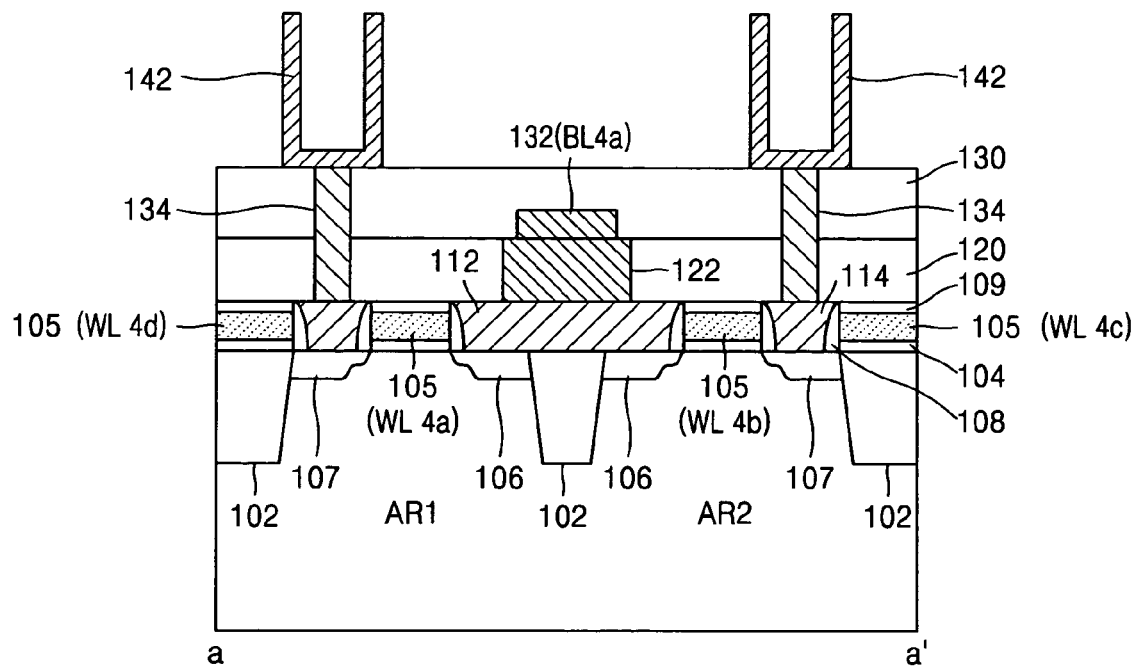
FIGS. 10a to 10e are cross-sectional views of a semiconductor memory device including a Capacitor Over Bit (COB) linestructure fabricated according to the layout shown in FIG. 9.
Figure 10B:
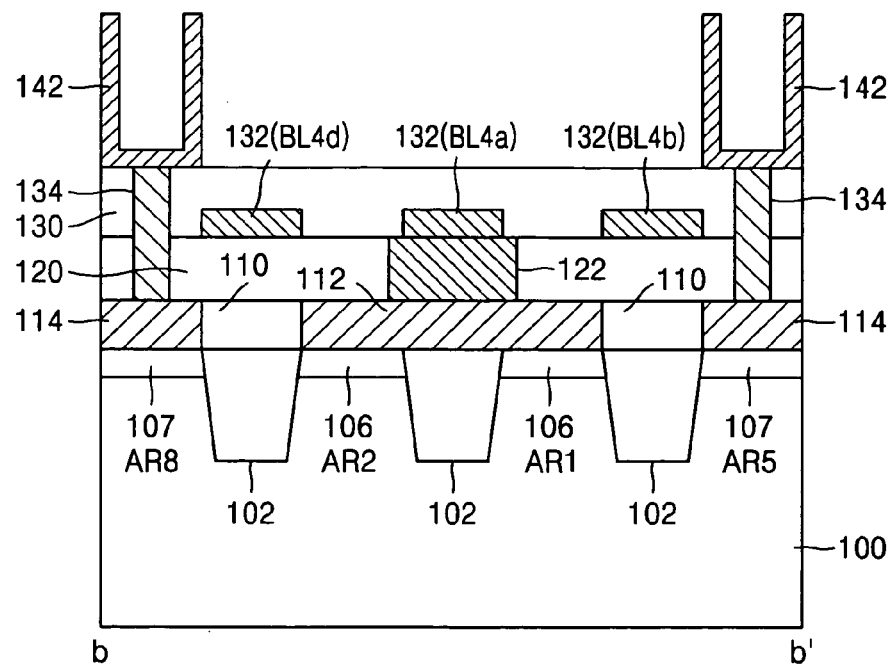
Figure 10C:
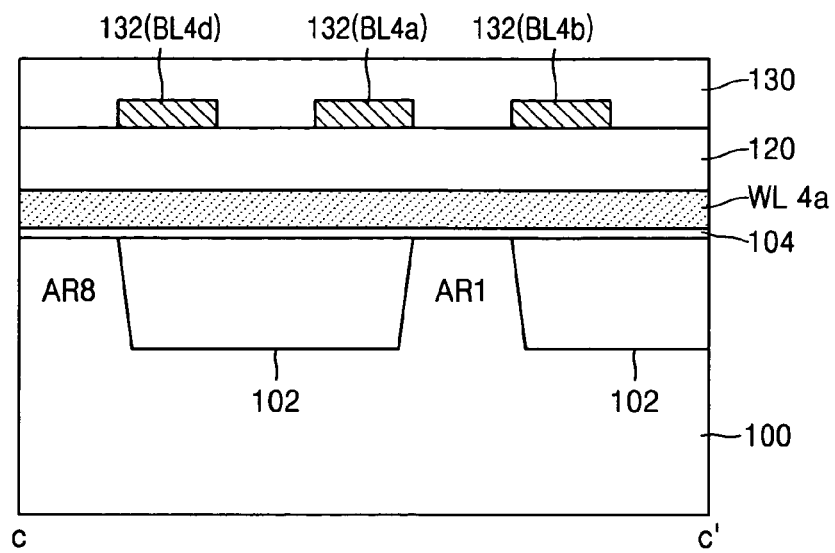

FIG. 6A shows a layout of bit line contacts 122(B/C) for directly connecting the first self-aligned contacts 112 shown in FIG. 10B to bit lines according to an exemplary embodiment of the present invention. FIG. 6B is a plan view of a mask pattern for forming the bit line contacts. FIG. 6C is a plan view of the bit line contacts printed on the wafer. FIG.

Figure 7A:
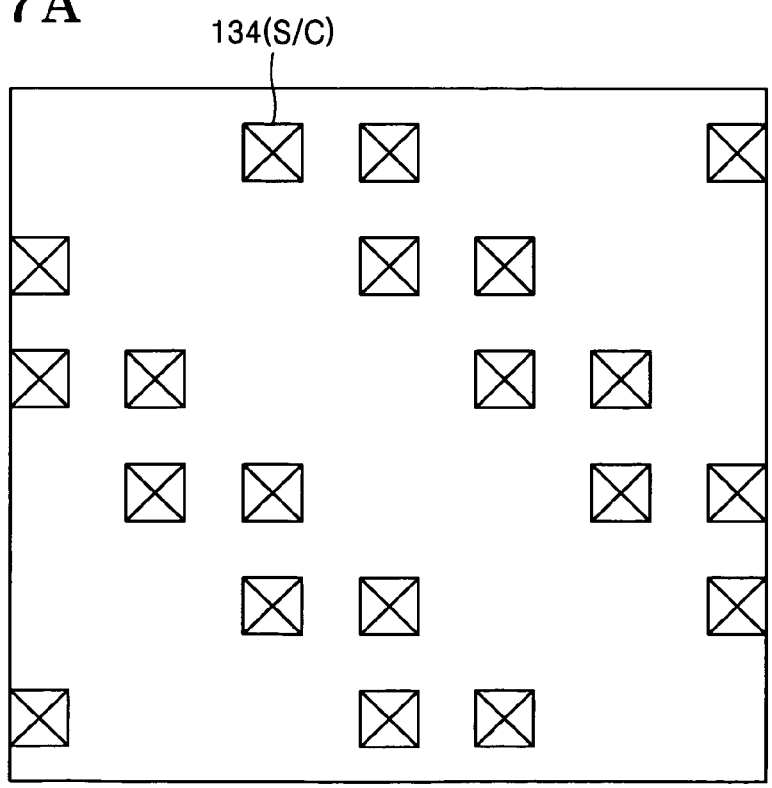
FIG. 7a shows a layout of storage node contacts of a memory cell array in a semiconductor memory device according to an exemplary embodiment of the present invention.
Figure 7B:
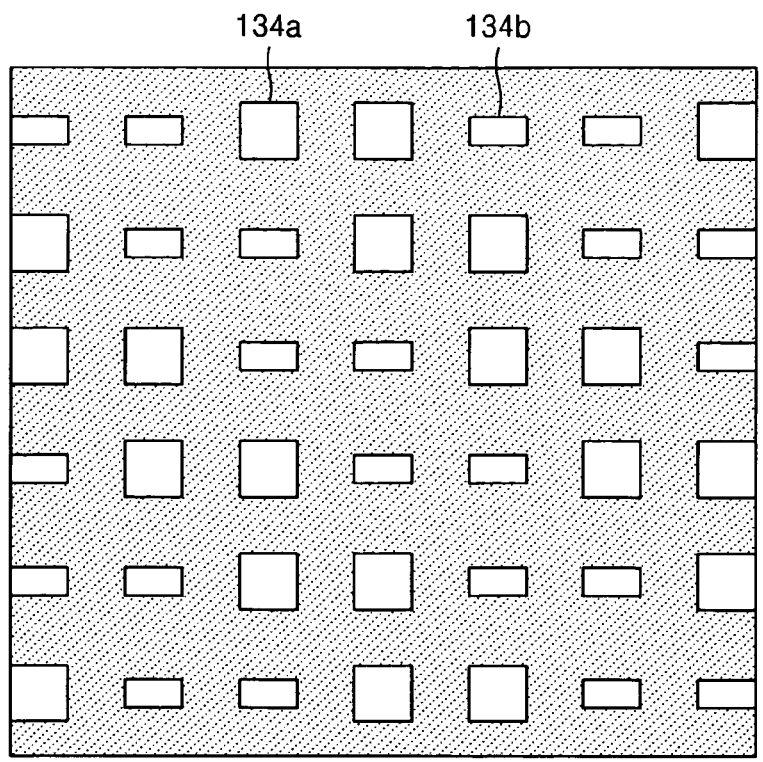
Figure 7C:
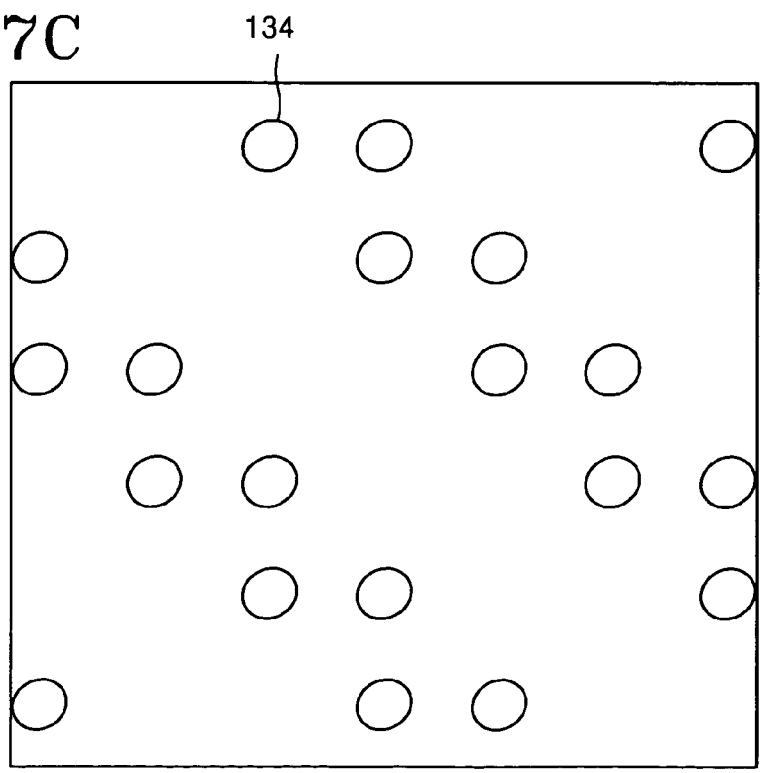
FIG. 7c is a plan view of the storage node contacts of FIG. 7a printed on a wafer.

7A shows a layout of storage node contacts 134(S/C) for connecting the second self-aligned contacts 114 shown in FIG. 10B to storage nodes of a charge storage capacitor according to an embodiment of the present invention. FIG. 7B is a plan view of a mask pattern for forming the storage node contacts 134 (S/C). FIG. 7C is a plan view of an actual image of the storage node contacts 134 printed on the wafer.

Referring to FIGS. 6A, 6B, 6C, 7A, 7B, and 7C, the bit line contacts 122 and the storage node contacts 134 of the memory cell array according to an exemplary embodiment of the present invention have photolithography friendliness. To fabricate the mask patterns used to form the bit line contacts 122 and the storage node contacts 134 are not complicated.

Figure 8:
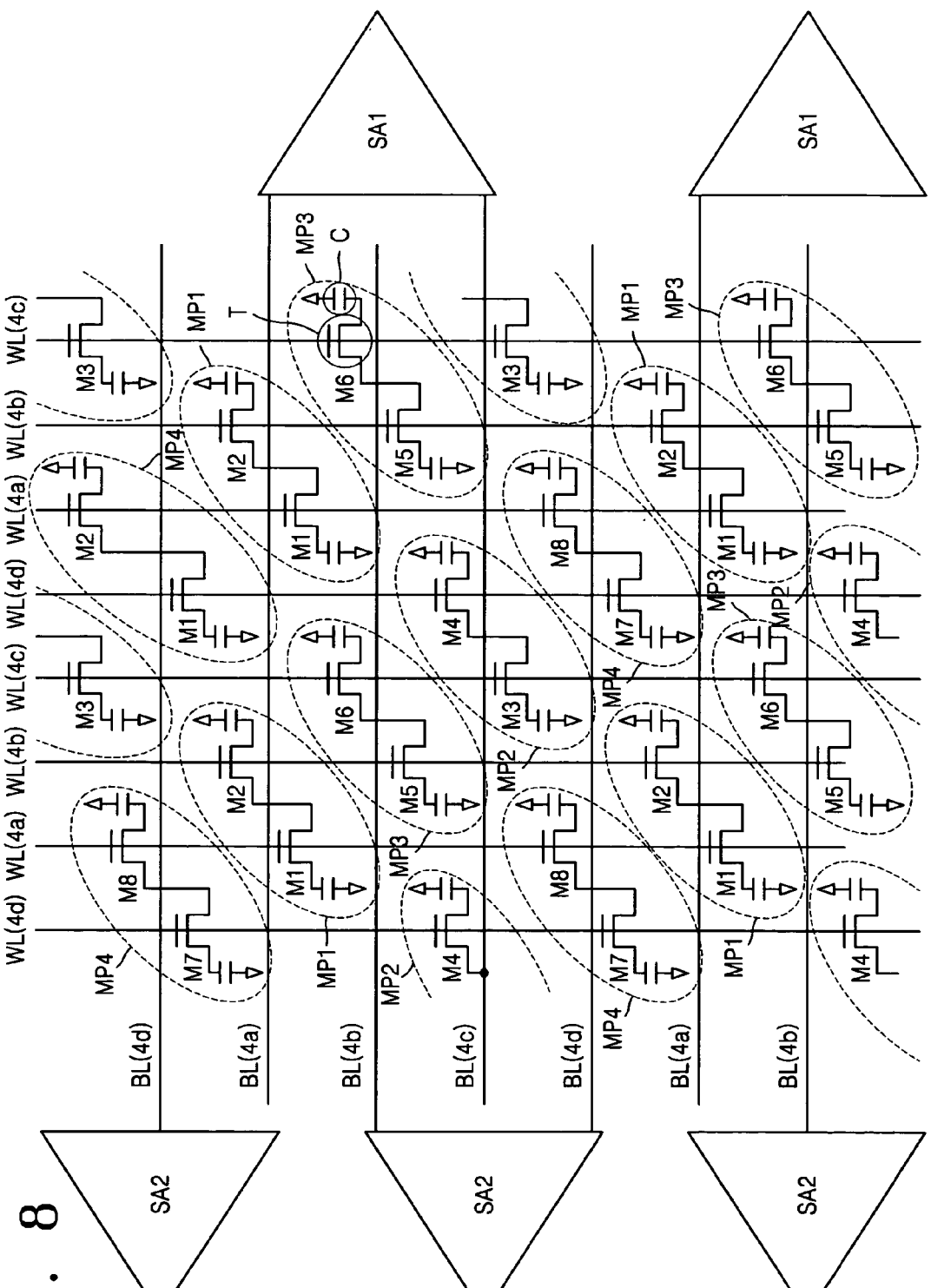
FIG. 8 is a circuit diagram of a memory cell array of a semiconductor memory device according to an exemplary embodiment of the present invention.
Figure 9:
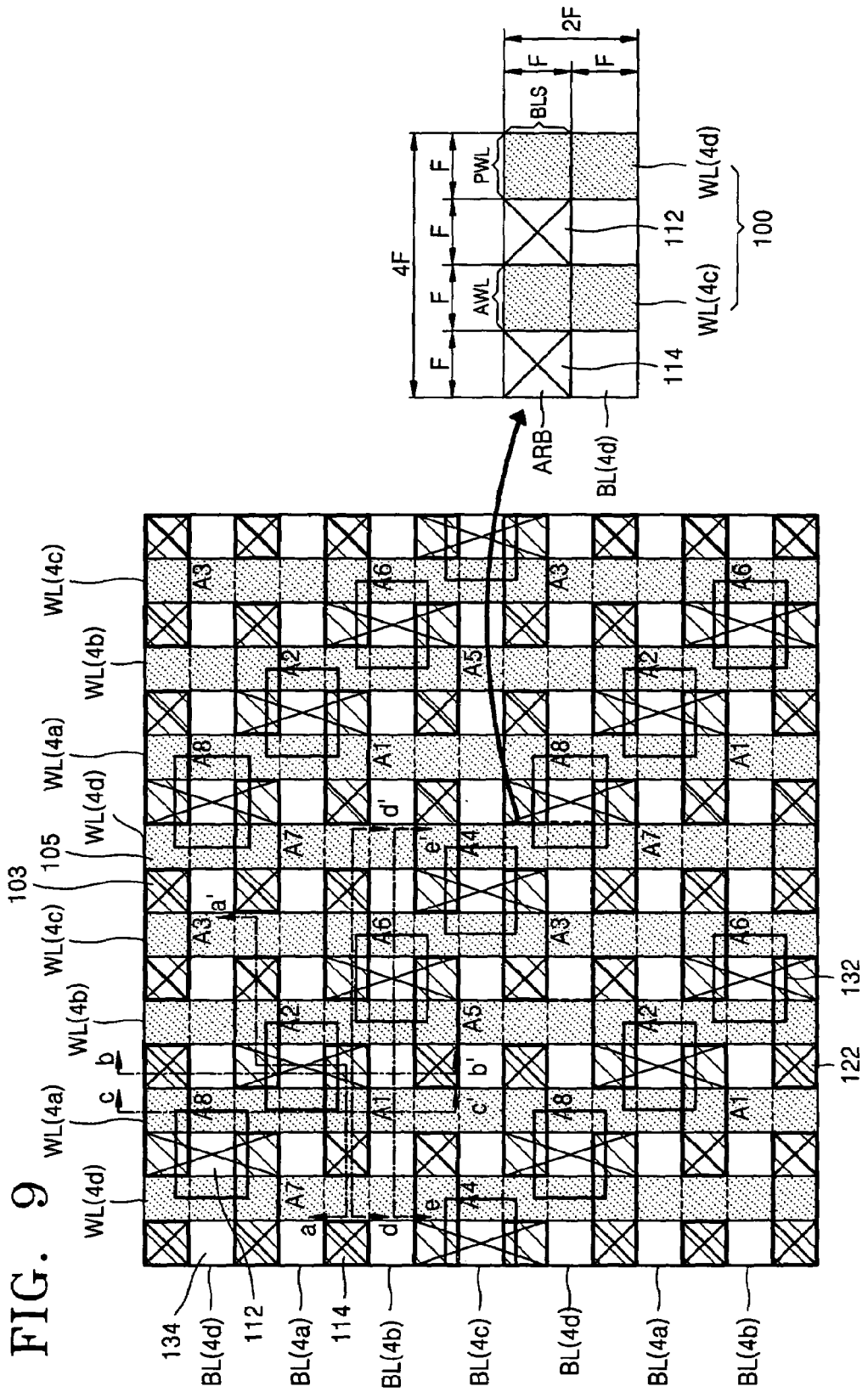
FIG. 9 shows a layout of the memory cell array shown in FIG. 8.

FIG. 8 is a circuit diagram of the memory cell array according to an exemplary embodiment of the present invention. FIG. 9 shows a layout of the memory cell array shown in FIG. 8.

Referring to FIGS. 8 and 9, memory cells M including one transistor and one capacitor are arranged in a checkered pattern. A plurality of word lines WL are arranged in parallel and a plurality of bit lines BL are arranged perpendicularly to the word lines WL. The memory cells are connected to the bit lines BL. The transistors of the memory cells are connected to the word lines WL.

The memory cell array according to an exemplary embodiment of the present invention includes memory cell pairs MP1, MP2, MP3 and MP4. Neighboring memory cells, for example M1 and M2, are connected to a single bit line BL.

The word lines WL include a repeated pattern of four word lines WL(4a), WL(4b), WL(4c) and WL(4d). Two memory cells are connected to a single bit line BL to form a memory cell pair in every four word lines WL(4a), WL(4b), WL(4c) and WL(4d). The bit lines BL include a pattern of four bit lines BL(4a), BL(4b), BL(4c) and BL(4d). Memory cell pairs having the same construction are repeatedly arranged in every four bit lines BL(4a), BL(4b), BL(4c) and BL(4d).

The first memory cell pair MP1 includes a first memory cell M1 formed in a first active region A1 intersecting the word line WL(4a) and a second memory cell M2 formed in a second active region A2 intersecting the word line WL(4b). The first and the second memory cells M1 and M2 are connected to the bit line BL(4a).

The second memory cell pair MP2 includes a third memory cell M3 formed in a third active region A3 intersecting the word line WL(4c) and a fourth memory cell M4 formed in a fourth active region A4 intersecting the word line WL(4d). The third and the fourth memory cells M3 and M4 are connected to the bit line BL(4c).

The third memory cell pair MP3 includes a fifth memory cell M5 formed in a fifth active region A5 intersecting the word line WL(4b) and a sixth memory cell M6 formed in a sixth active region A6 intersecting the word line WL(4c). The fifth and the sixth memory cells M5 and M6 are connected to the bit line BL(4b).

The fourth memory cell pair MP4 includes a seventh memory cell M7 formed in a seventh active region A7 intersecting the word line WL(4d) and an eighth memory cell M8 formed in an eighth active region A8 intersecting the word line WL(4a). The seventh and the eighth memory cells M7 and M8 are connected to the bit line BL(4d).

The bit lines BL(4a) and BL(4c) to which the first and the second memory cell pairs MP1 and MP2 are connected are coupled to a first sense amplifier SA1 formed on one side of the memory cell array. The bit lines BL(4b) and BL(4d) to which the third and the fourth memory cell pairs MP3 and MP4 are connected are coupled to a second sense amplifier SA2 formed on the other side of the memory cell array.

The memory cell array of the semiconductor memory device according to an exemplary embodiment of the present invention includes unit memory cells. A unit memory cell 100 is shown in FIG. 9. The length of the unit memory cell 100 is four times (i.e., 4F) of a minimum feature size F. The width of the unit memory cell 100 is two times (i.e., 2F) of the minimum feature size F. Thus, the cell size of the unit memory cell 100 is $8F^2$ (4F×2F). In other words, an access word line AWL of the unit memory cell 100 has one minimum feature size F. A first self-aligned contact 112 for connecting the bit line 132 to the first impurity region 106 serving as a drain has a minimum feature size F. A second self-aligned contact 114 for connecting the storage node of the capacitor of the memory cell to the second impurity region 107 serving as a source region has a minimum feature size F. A pass word line PWL of the unit memory cell 100 has a minimum feature size F. The width of a bit line BL of the unit memory cell 100 is a minimum feature size F. The width of a bit line space BLS is a minimum feature size F.

FIGS. 10A to 10E are cross-sectional views of a semiconductor memory device including a Capacitor Over Bit (COB) line structure fabricated according to the layout shown in FIG. 9. Specifically, FIGS. 10A to 10E are cross-sectional views taken along lines a–a', b–b', c–c', d–d' and e–e' of FIG. 9, respectively.

The first impurity region 106 serves as a drain region. The second impurity region 107 serves as a source region. The first and the second impurity regions 106 and 107 are formed in the active regions AR1 and AR 2 defined by shallow trench isolation regions 102. Each word line 105 is formed on a channel region with a gate insulating layer 104 positioned between the word lines 105 and the channel region. The word lines 105 function as an access gate of the memory cell transistor. Side wall spacers 108 are formed on both sides of the word lines 105. A capping layer 109 is formed on the top of the word lines 105.

Figure 10D:
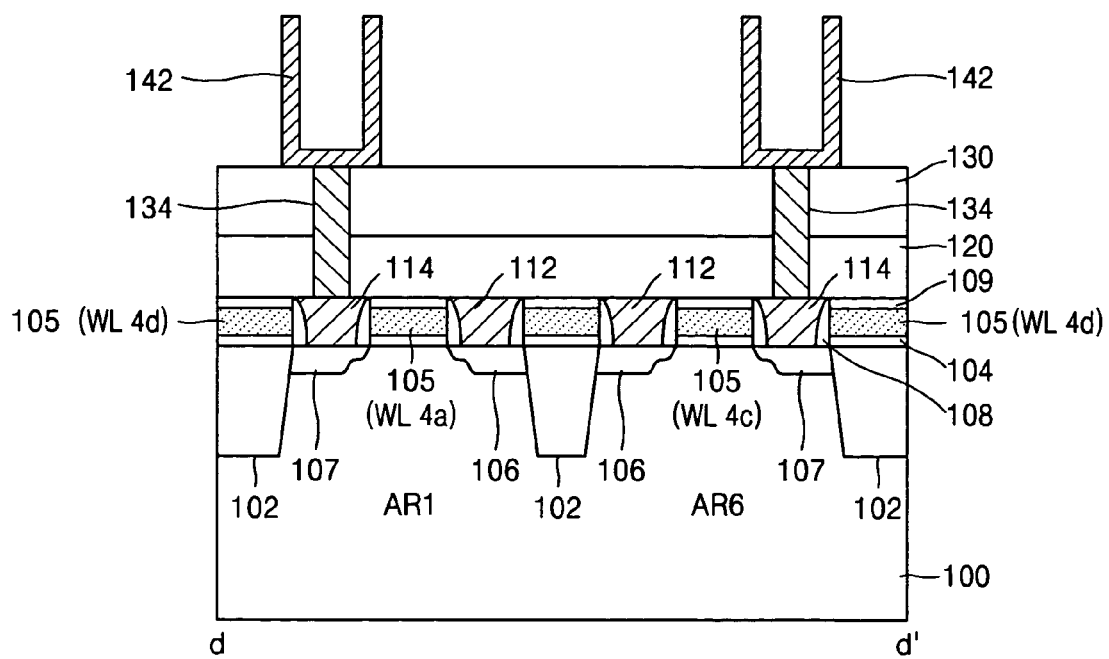
Figure 10E:
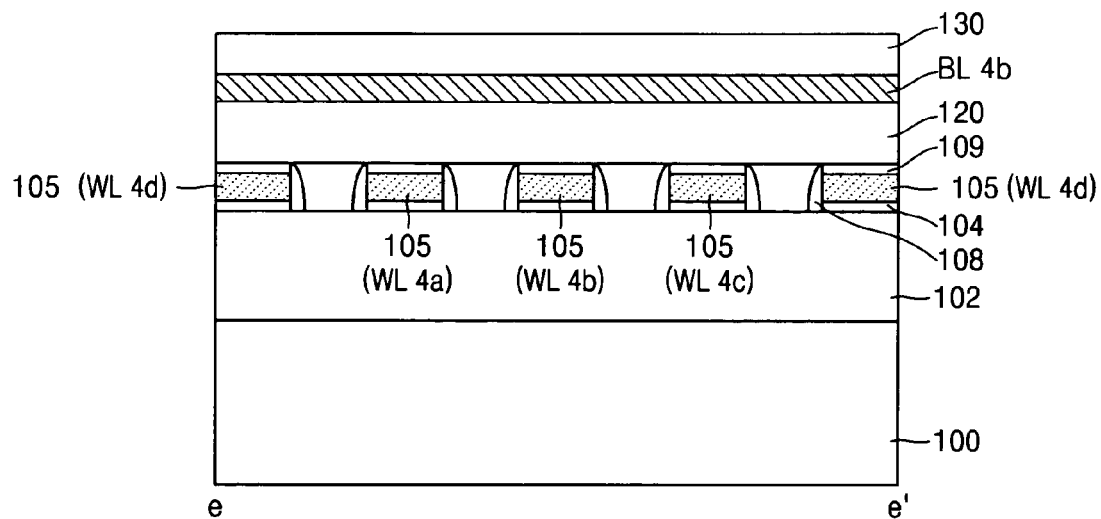

The first self-aligned contact 112 contacts with the first impurity region 106. The second self-aligned contact 114 contacts with the second impurity region 107. The first and the second self-aligned contacts 112 and 114 are formed in a first interlevel insulating layer 110. The first and the second self-aligned contacts 112 and 114 are self-aligned with the word lines WL 4a, WL 4b, WL 4c and WL 4d. As shown in FIGS. 10a and 10b, the first self-aligned contact 112 contacts with the first impurity region 106 formed in neighboring regions AR1 and AR2. Two of the first self-aligned contacts 112 are connected to each other such that the first and the second memory cells M1 and M2 construct one memory cell pair MP1 (as shown in FIG. 8). In other words, two of the first self-aligned contacts 112 are connected to each other on the isolation region 102 such that two memory cells M1 and M2 are connected to a bit line 132. In contrast, two isolated self-isolated contacts 112 are shown in FIG. 10D.

The bit line 132 (BL4a) is connected to the first impurity region 106 via the bit line contact 122 formed in a second interlevel insulating layer 120. A storage node 142 of a charge storage capacitor is connected to the second impurity region 107 via a storage node contact 134 formed in the second interlevel insulating layer 120 and a third interlevel insulating layer 130.

While FIGS. 10A to 10E show the COB structure, it will be understood by those of ordinary skill in the art that the memory cell array of the present disclosure can be formed with a Capacitor Under Bit (CUB) line structure. Preferably, processes of forming the self-aligned contacts 112 and 114 in the CUB line structure are identical to the processes of forming the COB line structure. The cross-sectional structures shown in FIGS. 10A to 10E can be modified in various ways by those of ordinary skill in the art.

Exemplary embodiment of the invention will be further disclosed by comparing word line patterns according to the invention and the conventional art.

Figure 11:
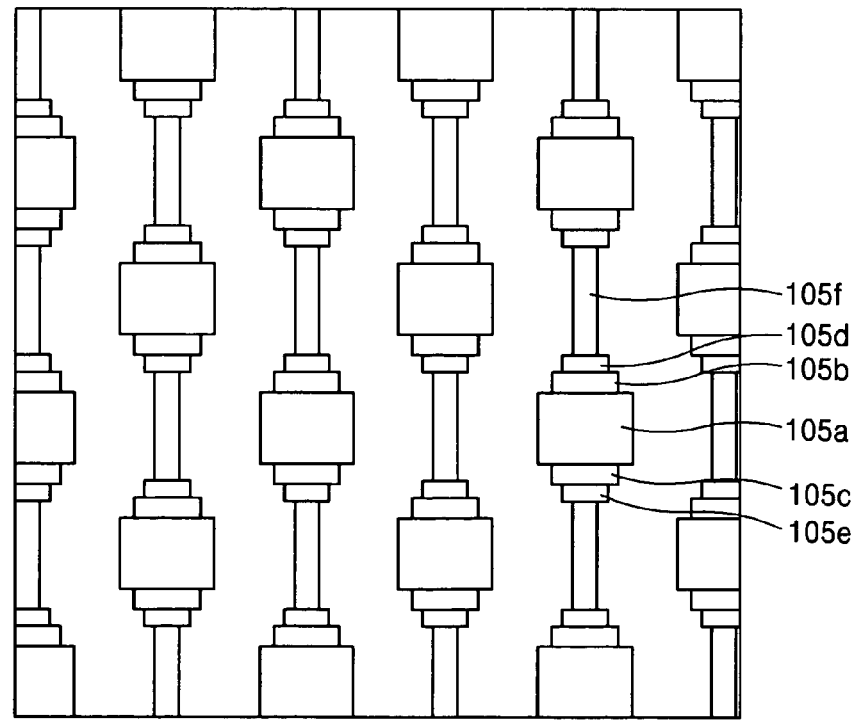
FIG. 11 is a plan view of a modified mask pattern used to form word lines of a memory cell array in a semiconductor memory device according to an exemplary embodiment of the present invention.

FIG. 11 is a plan view of a modified mask pattern for forming a word line of a memory cell array of a semiconductor memory device according to an exemplary embodiment of the present invention. Compared to the layout shown in FIG. 4A, the mask pattern shown in FIG. 11 has been modified such that the width of the access word line AWL formed on the active region 103 increases to the maximum, for example 105a, suitable for the operation of the memory cell transistor. Compared to the layout shown in FIG. 4A, the width of the pass word line PWL formed on the isolation region is reduced to the minimum, for example 105f, required for access signal transmission.

Figure 2A:
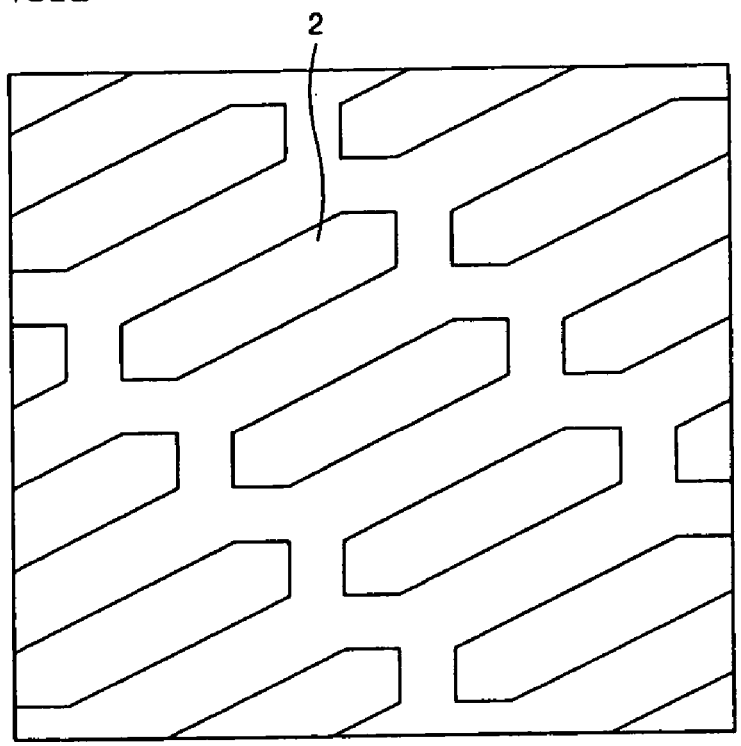
FIG. 2a shows a conventional layout of diagonal active regions.
Figure 2B:
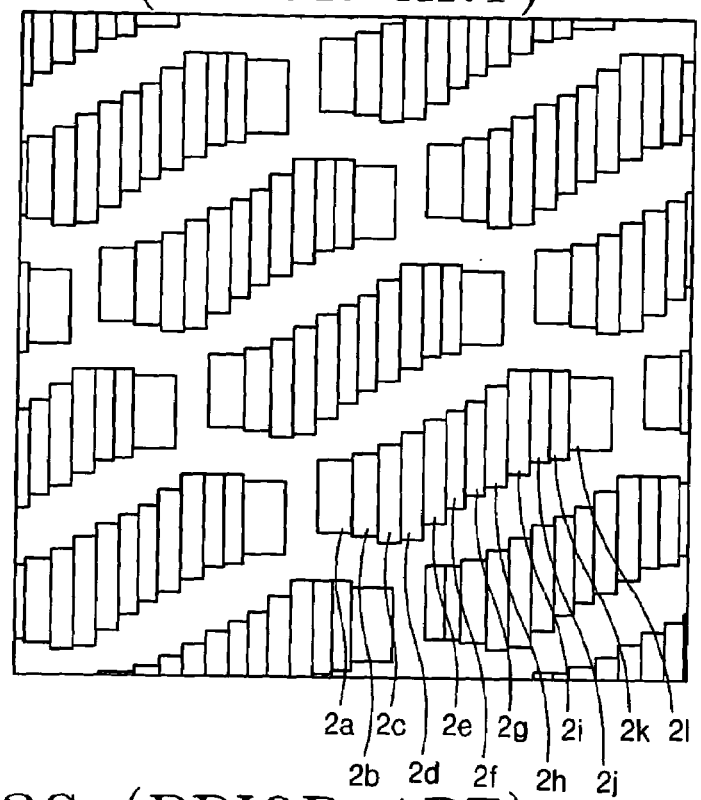
Figure 2C:
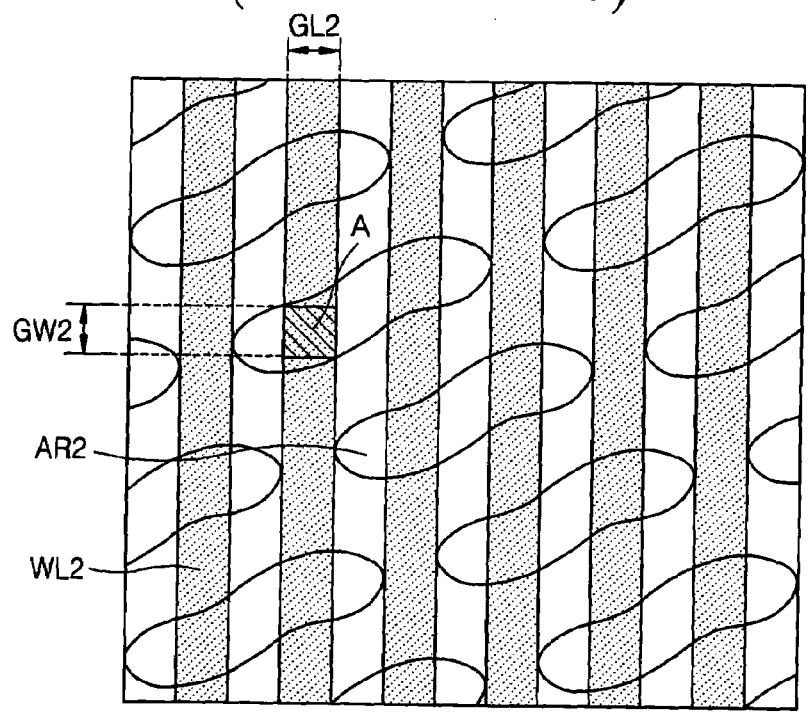
FIG. 2c is a plan view of the diagonal active regions of FIG. 2a and word lines printed on a wafer.
Figure 12:
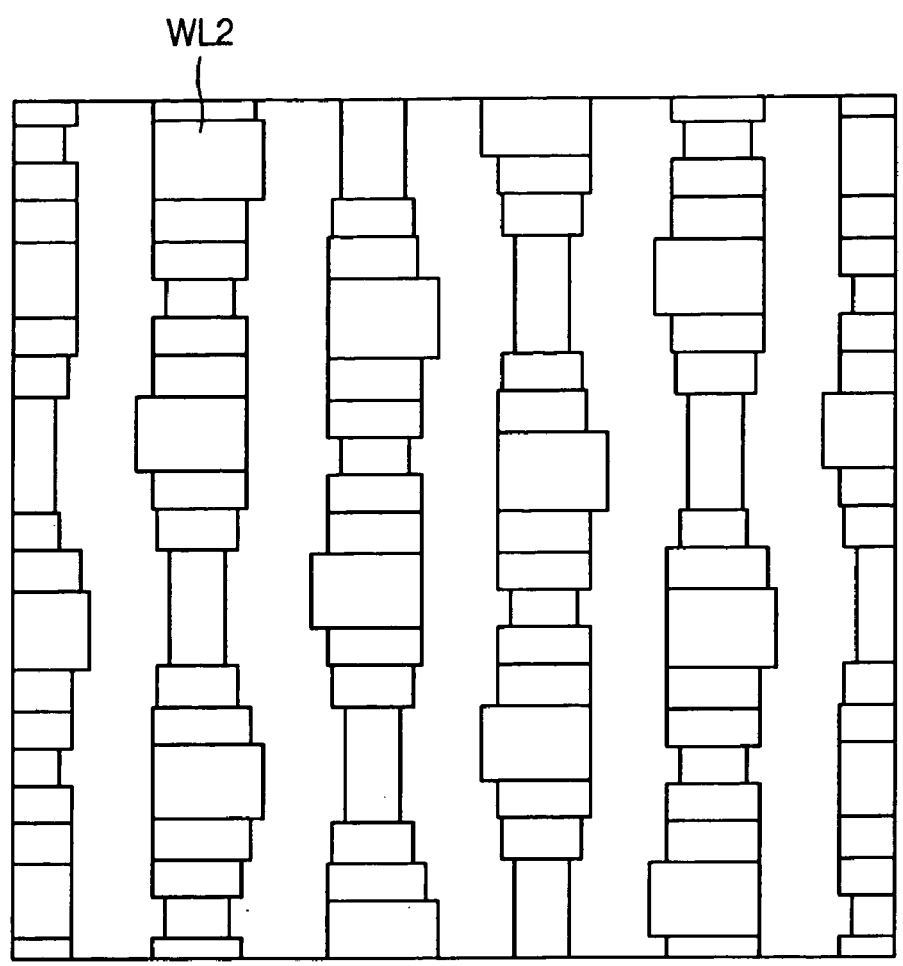
FIG. 12 is a plan view of a modified mask pattern of word lines formed on a conventional layout of diagonal active regions.

FIG. 12 is a plan view of a mask pattern of word lines WL2 formed on the conventional layout of the diagonal active regions (for example, 2 shown in FIG. 2a).

The word line pattern according to an exemplary embodiment of the present invention includes five patterns 105a, 105b, 105c, 105d and 105e symmetrically arranged as shown in FIG. 11. The word line pattern according to an exemplary embodiment of the present invention is much simpler than the mask pattern (FIG. 12) of the conventional art.

Exemplary embodiment of the invention will be further disclosed by comparing the areas of the intersections of the word lines and active regions according to the present invention and the conventional art.

Figure 13:
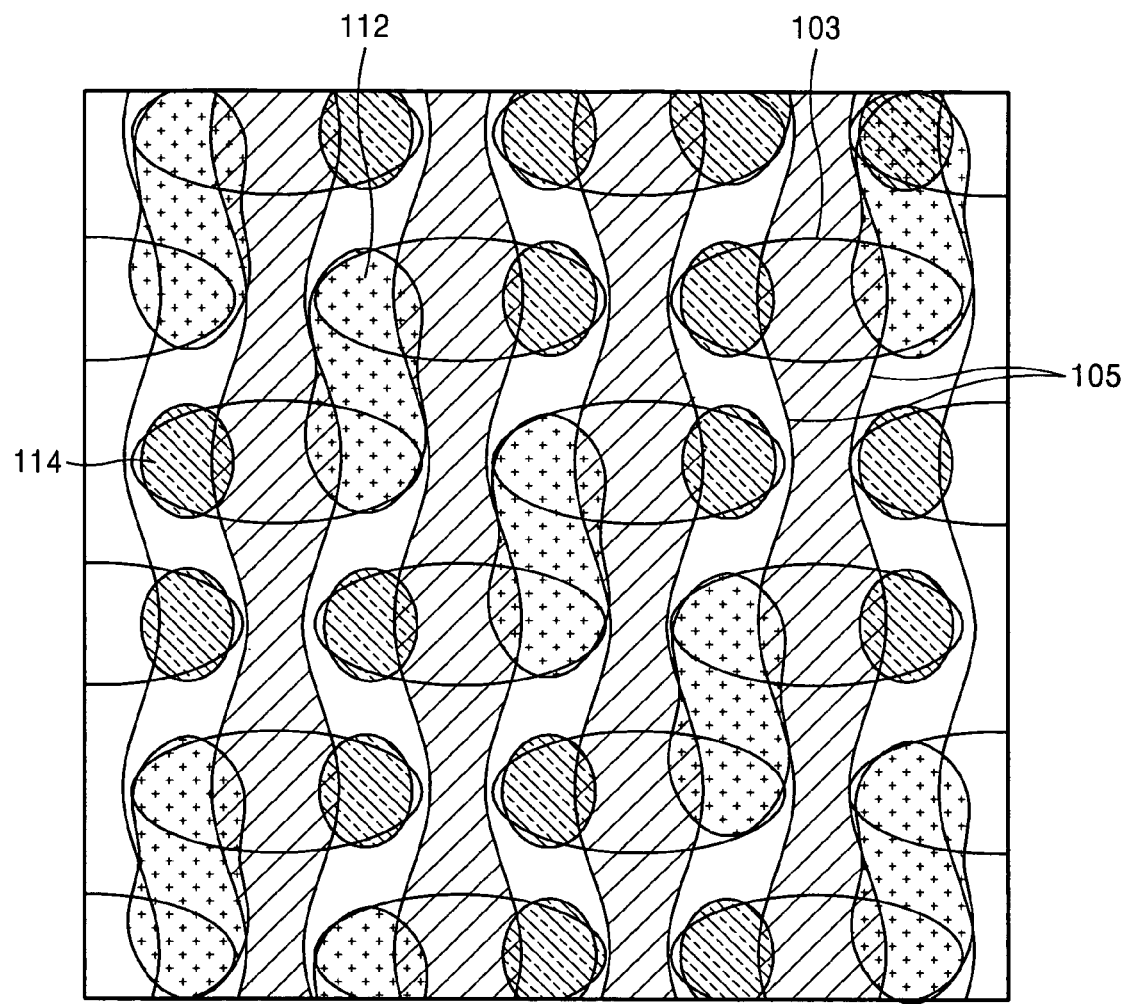
FIG. 13 is a plan view showing an image of the word lines of FIG. 11, and an image of active regions and self-aligned contacts modified according to the word lines of FIG. 11.

In an exemplary embodiment of the present invention, mask patterns of the active regions, word lines, and self-aligned contacts are formed according to 0.1 μm design rule. Then, images formed when the active regions, the word lines, and the self-aligned contacts are actually transferred onto a wafer were simulated. The layout of FIG. 11 was used as the word line layout. Thus the active regions and self-aligned contact layouts were also able to be modified. FIG. 13 is a plan view showing the simulated images of the active regions 103, word lines 105, and self-aligned contacts 112 and 114.

Images of straight and diagonal active regions and word lines of the conventional art were also simulated through the same design rule such as, for example, the 0.1 μm design rule. The ratio between: gate pattern widths of the conventional layout of straight active regions; gate pattern widths of the conventional layout of diagonal active regions; and gate pattern widths was measured as 1:1.2:1.4 according to an exemplary embodiment of the present invention. The gate pattern width corresponds to the intersection of the active region and the word line. The gate pattern width is used to calculate the actual gate area.

Figure 14:
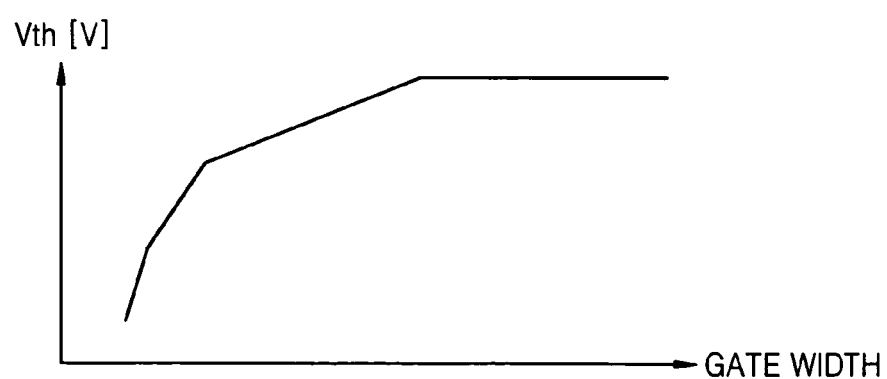
FIG. 14 is a graph showing a relationship between a sub-threshold voltage and a gate width.

Referring to FIG. 14, a threshold voltage Vth increases as the gate width increases. The increased threshold voltage decreases sub-threshold leakage current and improves the dynamic refresh characteristics of DRAMs. Furthermore, the memory cell array according to an exemplary embodiment of the present invention has a margin of maximum 40% in the design rule compared to the conventional art.

The semiconductor memory device according to an exemplary embodiment of the present invention has a symmetrical memory cell structure such that it has mask and photolithography friendliness. Since the intersection of the word lines and active regions (i.e., the actual gate width) increases by approximately 40% over the conventional art, the performance of the memory cell transistor improves and the design rule has a margin of approximately 40%.

Although exemplary embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor memory device comprising:
   a substrate;
   a plurality of word lines extended in a column direction and arranged in parallel on the substrate;
   a plurality of bit lines extended in a row direction perpendicular to the column direction such that the bit lines intersect the word lines and are arranged in parallel on the substrate;
   a plurality of active regions formed on the substrate, wherein each of the active regions includes a first impurity region, a second impurity region, and a channel region defined by the first impurity region and the second impurity region, wherein the channel region is crossed by each word line formed on the channel region; and
   a memory cell array comprising a plurality of memory cell pairs, wherein each memory cell of a memory cell pairs is formed in one of the active regions and comprises a charge storage capacitor, a first contact connecting one of the bit lines to the first impurity region, and a second contact connecting a storage node of the charge storage capacitor to the second impurity region, wherein each first contact of the memory cell pairs is electrically connected to each other.

2. The semiconductor memory device as claimed in claim 1, wherein each of the plurality of word lines intersects a center of each of the plurality of active regions.

3. The semiconductor memory device as claimed in claim 2, wherein each of the plurality of word lines perpendicularly intersects each of the plurality of the active regions.

4. The semiconductor memory device as claimed in claim 1, wherein the plurality of active regions are arranged parallel to the plurality of bit lines.

5. The semiconductor memory device as claimed in claim 1, wherein the first and second contacts are self-aligned by the plurality of word lines.

6. The semiconductor memory device as claimed in claim 1, wherein each first contacts of the memory cell pair is connected to each other in an isolation region defining the active regions in which the memory cell pair is formed.

7. A semiconductor memory device comprising:
   a plurality of word lines arranged such that a group in the order of a first, a second, a third and a fourth word lines repeats;
   a plurality of bit lines arranged such that a group in the order of a first, a second, a third and a fourth bit lines repeats;
   first memory cell pairs arranged in a matrix form and connected to the first bit line, each of the first memory cell pairs comprising a first memory cell formed in a first active region intersecting the first word line and a second memory cell formed in a second active region intersecting the second word line;

second memory cell pairs arranged in the matrix form and connected to the third bit line, each of the second memory cell pairs comprising a third memory cell formed in a third active region intersecting the third word line and a fourth memory cell formed in a fourth active region intersecting the fourth word line;

third memory cell pairs arranged in the matrix form and connected to the second bit line, each of the third memory cell pairs comprising a fifth memory cell formed in a fifth active region intersecting the second word line and a sixth memory cell formed in a sixth active region intersecting the third word line; and fourth memory cell pairs arranged in the matrix form and connected to the fourth bit line, each of the fourth memory cell pairs comprising a memory cell formed in a seventh active region intersecting the fourth word line and a memory cell formed in an eighth active region intersecting the first word line belonging to a group adjacent to the word line group including the fourth word line.

8. The semiconductor memory device as claimed in claim 7, wherein each of the plurality of word lines intersects a center of each of the plurality of active regions.

9. The semiconductor memory device as claimed in claim 7, wherein each of the plurality of word lines perpendicularly intersects each of the plurality of the active regions.

10. The semiconductor memory device as claimed in claim 7, wherein the plurality of active regions are arranged parallel to the plurality of bit lines.

11. The semiconductor memory device as claimed in claim 7, wherein a contact connecting the first memory cell pair to the first bit line is self-aligned by the first and the second word lines, a contact connecting the second memory cell pair to the third bit line is self-aligned by the third and the fourth word lines, a contact connecting the third memory cell pair to the second bit line is self-aligned by the second and the third word lines, and a contact connecting the fourth memory cell pair to the fourth bit line is self-aligned by the fourth word line and the first word line of next group.

12. The semiconductor memory device as claimed in claim 7, wherein each memory cell includes a charge storage capacitor, and contacts connecting the storage node of the charge storage capacitor to the impurity regions of the active regions are self-aligned by the plurality of word lines.

13. The semiconductor memory device as claimed in claim 7, wherein the first and the third bit lines adjacent to each other are connected to a first sense amplifier, and the second and the fourth bit lines adjacent to each other are connected to a second sense amplifier.

14. A semiconductor memory device comprising:

a unit cell having a length equal to four minimum feature size in a row direction and a length equal to two minimum feature size in a column direction such that the unit cell has an area equal to eight minimum feature size squared, wherein each of an access word line, a storage node contact, a bit line contact, and a pass word line have one minimum feature size in the row direction, wherein each of a bit line and a bit line space have one minimum feature size in the column direction.

* * * * *